(12) United States Patent
Biolsi et al.

(10) Patent No.: US 6,677,678 B2
(45) Date of Patent: Jan. 13, 2004

(54) DAMASCENE STRUCTURE USING A SACRIFICIAL CONDUCTIVE LAYER

(75) Inventors: Peter E. Biolsi, Essex Junction, VT (US); Gregory S. Jankowski, Milton, VT (US); Laurie M. Krywanczyk, Essex Junction, VT (US); Anthony K. Stamper, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/195,763

(22) Filed: Jul. 15, 2002

(65) Prior Publication Data

US 2002/0177301 A1 Nov. 28, 2002

Related U.S. Application Data

(62) Division of application No. 09/525,308, filed on Mar. 14, 2000, now Pat. No. 6,444,557.

(51) Int. Cl.⁷ ............................................... H01L 23/48
(52) U.S. Cl. ...................... 257/751; 257/750; 257/774; 257/528; 438/597; 438/687
(58) Field of Search .................. 257/528, 529, 257/774, 750, 751; 438/597, 687, 652, 653

(56) References Cited

U.S. PATENT DOCUMENTS

| | | | |
|---|---|---|---|
| 4,659,205 A | | 4/1987 | Yokoyama et al. |
| 5,477,057 A | | 12/1995 | Angeley et al. |
| 5,550,007 A | | 8/1996 | Taylor et al. |
| 5,824,599 A | | 10/1998 | Schacham-Diamand et al. |
| 5,882,999 A | | 3/1999 | Anderson et al. |
| 5,906,911 A | | 5/1999 | Cote |
| 5,910,453 A | * | 6/1999 | Gupta et al. .................. 438/717 |
| 5,933,761 A | | 8/1999 | Lee |
| 6,121,156 A | * | 9/2000 | Shamble et al. ............. 438/734 |
| 6,225,217 B1 | | 5/2001 | Usami et al. |
| 6,323,076 B1 | * | 11/2001 | Wilford ....................... 438/215 |
| 6,355,555 B1 | * | 3/2002 | Park ............................ 438/634 |

* cited by examiner

Primary Examiner—Michael S. Lebentritt
Assistant Examiner—Brad Smith
(74) Attorney, Agent, or Firm—Schmeiser, Olsen & Watts; William D. Sabo

(57) ABSTRACT

A method of forming a damascene structure, and the structure so formed, using a sacrificial conductive layer to provide a uniform focus plane for the photolithography tool during formation of circuit features. In particular, a metal layer is provided between the insulative layer and the photoresist, upon which the capacitive sensors of the photolithography tool focus during the formation of the circuit features, namely, troughs and vias.

20 Claims, 14 Drawing Sheets

TABLE 1

TROUGH FIRST / VIA SECOND DUAL DAMASCENE:

| PROCESS | RF TOP | RF BOT | PRESS | CO | C4F8 | Ar | CF4 | CHF3 | O2 | ELEC TEMP |
|---|---|---|---|---|---|---|---|---|---|---|
| TROUGH OR VIA RESIST REWORK | 800 | 200 | 500mT | 0 | 0 | 0 | 0 | 0 | 500 | 10C |
| TROUGH ARC OPEN | 600 | 600 | 60mT | 0 | 0 | 450 | 60 | 0 | 20 | 10C |
| TROUGH RIE | 500 | 1100 | 60mT | 0 | 0 | 450 | 60 | 0 | 10 | 10C |
| TROUGH RESIST STRIP | 800 | 0 | 500mT | 0 | 0 | 0 | 0 | 0 | 500 | 10C |
| TROUGH RESIST OVER STRIP | 800 | 200 | 500mT | 0 | 0 | 00 | 0 | 0 | 500 | 10C |
| VIA OXIDE RIE | 1000 | 2000 | 28mT | 100 | 6 | 100 | 0 | 0 | 5 | 20C |
| VIA RESIST STRIP | 800 | 0 | 500mT | 0 | 0 | 0 | 0 | 0 | 500 | 20C |
| VIA RESIST OVER STRIP | 800 | 200 | 500mT | 0 | 0 | 0 | 0 | 0 | 500 | 20C |
| NITRIDE RIE | 600 | 600 | 60mT | 0 | 0 | 450 | 60 | 20 | 10 | 20C |

*FIG. 14a*

TABLE 2

VIA FIRST / TROUGH SECOND DUAL DAMASCENE:

| PROCESS | RF TOP | RF BOT | PRESS | CO | C4F8 | Ar | CF4 | CHF3 | N2 | O2 | ELEC TEMP |
|---|---|---|---|---|---|---|---|---|---|---|---|
| TROUGH OR VIA RESIST REWORK | 800 | 200 | 500mT | 0 | 0 | 0 | 0 | 0 | 0 | 500 | 10C |
| VIA ARC OPEN | 600 | 600 | 60mT | 0 | 0 | 450 | 60 | 0 | 0 | 20 | 10C |
| VIA OXIDE RIE | 1000 | 2000 | 30mT | 100 | 6 | 100 | 0 | 0 | 0 | 5 | 10C |
| VIA RESIST STRIP | 800 | 0 | 500mT | 0 | 0 | 0 | 0 | 0 | 0 | 500 | 10C |
| VIA RESIST OVER STRIP | 800 | 200 | 500mT | 0 | 0 | 0 | 0 | 0 | 0 | 500 | 10C |
| TROUGH ARC OPEN | 600 | 300 | 30mT | 150 | 0 | 40 | 0 | 0 | 0 | 10 | 20C |
| TROUGH RIE | 500 | 1100 | 60mT | 0 | 0 | 450 | 60 | 0 | 100 | 10 | 20C |
| TROUGH RESIST STRIP | 800 | 0 | 500mT | 0 | 0 | 0 | 0 | 0 | 0 | 500 | 20C |
| TROUGH RESIST OVER STRIP | 800 | 200 | 500mT | 0 | 0 | 0 | 0 | 0 | 0 | 500 | 20C |
| NITRIDE RIE | 600 | 600 | 60mT | 0 | 0 | 450 | 60 | 20 | 0 | 10 | 20C |

*FIG. 14b*

DAMASCENE STRUCTURE USING A SACRIFICIAL CONDUCTIVE LAYER

This application is a divisional of Ser. No. 09/525,308, filed on Mar. 14, 2000 now U.S. Pat. No. 6,444,557.

BACKGROUND OF THE INVENTION

1. Technical Field

The present invention relates generally to photolithography, and more particularly, to a method of forming a damascene structure, and the structure so formed, using a sacrificial conductive layer to provide a uniform focus plane for the photolithography tool.

2. Related Art

Damascene structures are constructed by the formation of circuit features within a dielectric layer of a semiconductor wafer. The circuit features are typically trenches and/or vias, for wiring and contacts, respectively. A single-damascene structure contains only one type of circuit feature, while a dual-damascene structure contains both types of circuit features. It is also possible to form damascene structures having more than two types of circuit features.

The circuit features of the damascene structures are typically formed by first depositing a layer of photoresist over the wafer dielectric layer. The layer of photoresist is then patterned using a photolithography tool. In particular, a coherent beam of light is targeted at the surface of the wafer, the photoresist is selectively developed or removed from the wafer, thus forming a specified pattern thereon. The dielectric layer is etched to form the desired circuit features therein. The layer of photoresist is then removed, thereby forming the first circuit features. In the formation of a single-damascene structure, the circuit features are then filled with a conductive material, and planarized.

In the alternative, the creation of a dual-damascene structure requires the formation of second circuit features following the etch step described above. In particular, a second layer of photoresist is deposited over the surface of the etched dielectric layer. The second layer of photoresist is patterned, and developed again using the photolithography tool. The dielectric layer is etched, generally to a different depth than that of the first circuit features, to form a plurality of second circuit features. In the event the first circuit features are trenches, the second circuit features are vias, and vice versa. A conductive material is then deposited over the surface of the wafer, filling both circuit features. The surface of the wafer is then planarized to form a damascene structure having wiring and/or contacts therein. Both single- and dual-damascene processing are commonly employed to fabricate damascene wires and vias.

Problem Description

The single- and dual-damascene patterning steps, however, are often difficult because some photolithography tools utilize capacitive sensors to determine the focus, or the distance between the light source of the photolithography tool and the wafer, necessary to pattern the desired circuit features. The capacitive sensors typically focus on metal layers customarily embedded within the dielectric layer of conventional wafers. In the event these metal layers are not connected to the substrate, commonly referred to as "floating" layers, the photolithography tool will not completely focus on these metal layers. In addition, because the local metal wiring layout density or pattern factor can vary between 0% and 100%, the capacitive sensor may focus on an underlying layer of metal or the substrate. This may lead to systematic errors in the measured focus.

As a result, in regions of the wafer where the focus is above or below the desired location, or "focus plane," the images produced may be printed smaller or larger than desired, may be printed with tapered resist profiles (i.e., less than 90 degree resist sidewall slopes), may be printed such that the developer does not fully remove the resist in the bottom of the feature, or may not be printed at all. Small or missing features formed therefrom, commonly referred to as "open" features, typically fail to provide the requisite electrical contact. Similarly, large features formed therefrom are commonly referred to as "blown" features, and often lead to shorts between adjacent features.

Accordingly, there exists a need in the industry for a method of accurately forming trenches and vias within damascene structures.

SUMMARY OF THE INVENTION

The present invention generally provides a method of forming a damascene structure, using a sacrificial conductive layer to provide the photolithography tool with a uniform focus plane during the formation of circuit features.

The first general aspect of the present invention provides a method of forming a damascene structure, comprising the steps of: providing a substrate having an insulative layer; depositing a sacrificial conductive layer on the insulative layer; and forming at least one circuit feature within the insulative layer. This aspect allows for more accurate formation of circuit features, e.g., trenches and vias, within a damascene structure, whether single- or dual-damascene. In particular, the sacrificial conductive layer provides the photolithography tool, used to pattern the trenches and vias, with a uniform focus plane.

The second general aspect provides a method of forming damascene lines within an insulated substrate, comprising the steps of: depositing a sacrificial conductive layer on the insulated substrate; and forming at least one circuit feature within the insulated substrate, using a patterning tool, wherein the sacrificial conductive layer provides a uniform focus plane for the patterning tool. This aspect allows for advantages similar to those associated with the first general aspect.

The third general aspect provides a damascene structure having a sacrificial conductive layer therein providing a uniform focus plane for a photolithography tool during patterning of an at least one circuit feature. This aspect provides a single- or dual-damascene structure produced using the method of the first and second aspects, and having similar advantages.

The fourth general aspect provides a damascene structure comprising: a substrate having an insulative layer; a sacrificial conductive layer on the insulative layer; and at least one circuit feature within the insulative layer of the substrate. This aspect also provides a single- or dual-damascene structure produced using the method of the first and second aspects, and having similar advantages.

The fifth general aspect provides a sacrificial conductive layer used in the formation of a damascene structure, wherein the sacrificial conductive layer provides a uniform focus plane during the formation of an at least one circuit feature. This aspect also provides a single- or dual-damascene structure produced using the method of the first and second aspects, and having similar advantages.

The foregoing and other features and advantages of the invention will be apparent from the following more particular description of preferred embodiments of the invention.

BRIEF DESCRIPTION OF THE DRAWINGS

The preferred embodiments of this invention will be described in detail, with reference to the following figures, wherein like designations denote like elements, and wherein:

FIG. 14a depicts a Table 1 showing a series of etching conditions, in accordance with a first embodiment of the present invention;

FIG. 14b depicts a Table 2 showing a series of etching conditions, in accordance with a second embodiment of the present invention;

DESCRIPTION OF THE PREFERRED EMBODIMENTS

Although certain preferred embodiments of the present invention will be shown and described in detail, it should be understood that various changes and modifications may be made without departing from the scope of the appended claims. The scope of the present invention will in no way be limited to the number of constituting components, the materials thereof, the shapes thereof, the relative arrangement thereof, etc., and are disclosed simply as an example of the preferred embodiment. Although the drawings are intended to illustrate the present invention, the drawings are not necessarily drawn to scale.

Figure 1:
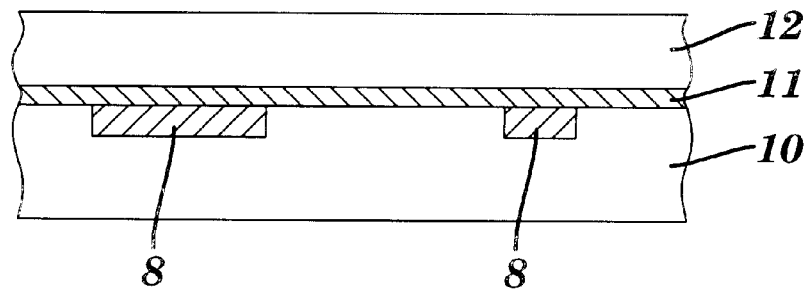
FIG. 1 depicts a wafer having a diffusion barrier and an insulative layer thereon, in accordance with a preferred embodiment of the present invention.

Referring to the drawings, FIG. 1 illustrates a semiconductor substrate or wafer 10 having damascene copper wiring 8 formed therein, using methods known and used in the art. A copper diffusion barrier layer 11 is deposited over the surface of the wafer 10 and wiring 8 to prevent the copper within the wiring 8 from diffusing into subsequent layers of the device. The diffusion layer 11 is preferably silicon nitride, or silicon carbide, however, other similar materials capable of preventing copper diffusion may also be used.

An insulative layer 12 is then deposited over the diffusion barrier 11, using known techniques. The insulative layer 12 is preferably a dielectric or oxide material, such as one or more of the following: $SiO_2$, doped silicon, hydrogen silsesquioxane, methyl silsesquioxane, $SiO_xC_yH_z$, silicon nitride, silicon carbide, polyarylene ether, amorphous hydrogenated carbon, silica aerogel, polyimide, etc.

It should be noted that the copper diffusion barrier 11 is not required if the intermetal dielectrics, namely the wiring 8 and the insulative layer 12, are not susceptible to copper diffusion. Likewise, the copper diffusion barrier 11 is not required if the wiring 8 is formed of another metal, such as W, Al, or AlCu (Cu <2 at. %), which typically does not diffuse into the insulative layer 12.

Figure 2A:
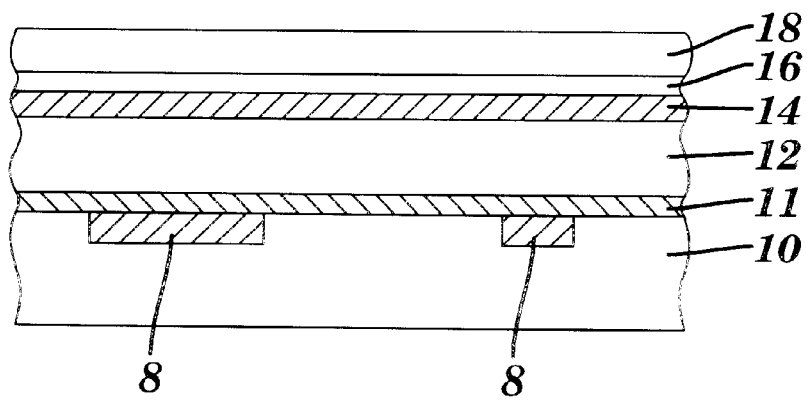
FIG. 2a depicts the wafer of FIG. 1 having a sacrificial conductive layer, an optional antireflective coating, and a layer of photoresist thereon, in accordance with a preferred embodiment of the present invention.

A sacrificial conductive layer 14 is then deposited over the insulative layer 12, as shown in FIG. 2a. The conductive layer 14 is preferably deposited using conventional physical vapor deposition (PVD) or chemical vapor deposition (CVD) techniques. The conductive layer 14, preferably a refractory metal, ranges in thickness from approximately 5–50 nm. The conductive layer 14 is preferably tungsten because during the subsequent reactive ion etch (RIE) the tungsten has a relatively high fluorine volatility. This enables the conductive layer 14 to be etched in perfluorocarbon (PFC) or hydrofluorocarbon (HFC) based chemistries, which are commonly employed during the subsequent RIE (discussed herein). Tungsten, measuring approximately 10 nm, has both low bulk resistivity and high fluorine etch byproduct volatility.

In the alternative, the conductive layer 14 may be any other comparable material, such as Ta, TiN, WN, Al, n-type or p-type doped Si, etc. However, if the conductive layer 14 is a material such as tantalum, which has low fluorine etch byproduct volatilities, a standard metal etch chemistry, based on Cl, $BC_{13}$, $SF_6$, etc., should be used during the subsequent etch step to etch the conductive layer 14.

Figure 2B:
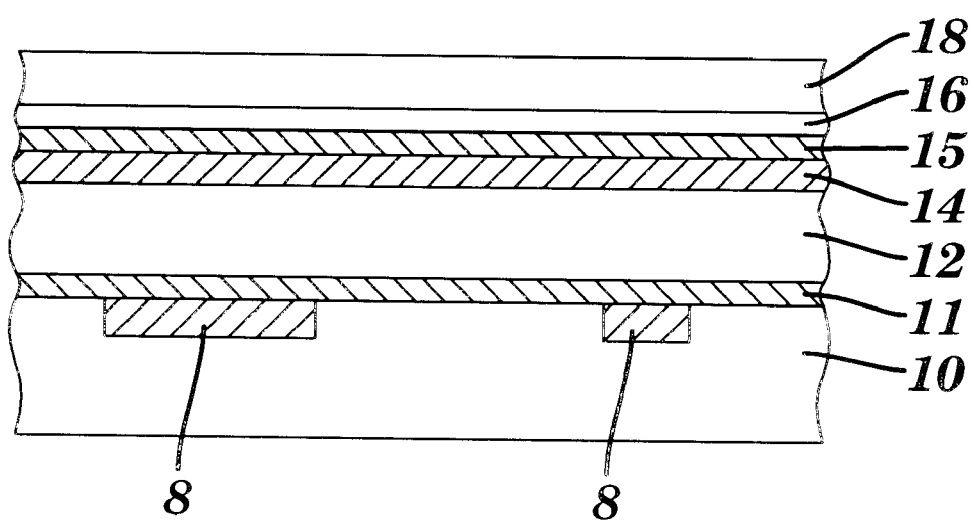
FIG. 2b depicts the wafer of FIG. 2a having an optional thin dielectric layer thereon, in accordance with an alternate embodiment.

An optional antireflective coating (ARC) 16 is deposited over the conductive layer 14, preferably using conventional spin-deposition techniques. The ARC 16 is preferably an organic coating, such as AR3™ (Shipley, Inc. of Massachusetts). A first layer of photoresist 18 is deposited over the ARC 16, using well known deposition techniques. Some ARC and photoresist materials, however, may not properly adhere to and/or coat the surface of the conductive layer 14. In that case, a thin layer of dielectric material 15 (refer to FIG. 2b) may be deposited over the conductive layer 14. The thin layer of dielectric 15 is preferably about 5–250 nm thick, and may be composed of one or more of the following materials: $SiO_2$, silicon, $Si_3N_4$, SiC (silicon carbide), etc. The thin layer of dielectric 15 may be deposited using conventional CVD or PVD techniques.

Figure 3A:
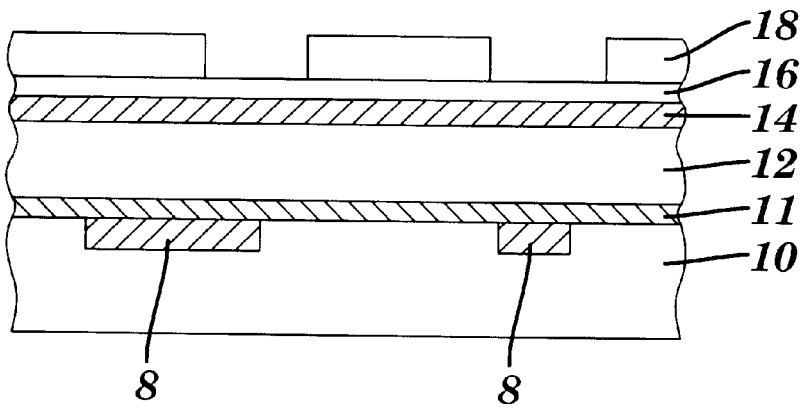
FIG. 3a depicts the wafer of FIG. 2a wherein the layer of photoresist is patterned, in accordance with a first embodiment of the present invention.

The first layer of photoresist 18 is exposed and developed, preferably using an excimer deep ultraviolet (DUV) 248 m lithography tool, to pattern the first circuit features on the surface of the wafer 10, as illustrated in FIG. 3a. Although the preferred embodiment uses a DUV lithographic tool, this invention could be used with any lithographic exposure tool including MUV (365 nm), sub-248 nm DUV (193 nm), electron beam, X-ray, etc. The ARC 16 and the conductive layer 14 are then etched using an ARC-open reactive ion etch (RIE) to form a pair of first circuit features, in this example trenches or troughs 20, as shown in FIG. 4a. To fully remove the sacrificial conductive layer 14 without leaving etch residuals, oxygen doping may be used during the PFC-based (perfluorocarbon) ARC open RIE. One set of ARC open process conditions are shown in Table 1 (see FIG. 14a).

Figure 5B:
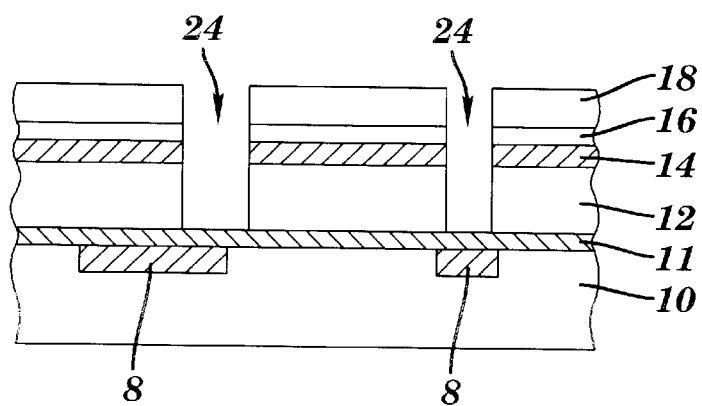
FIG. 5b depicts the formation of a via, in accordance with a second embodiment of the present invention.
Figure 5A:
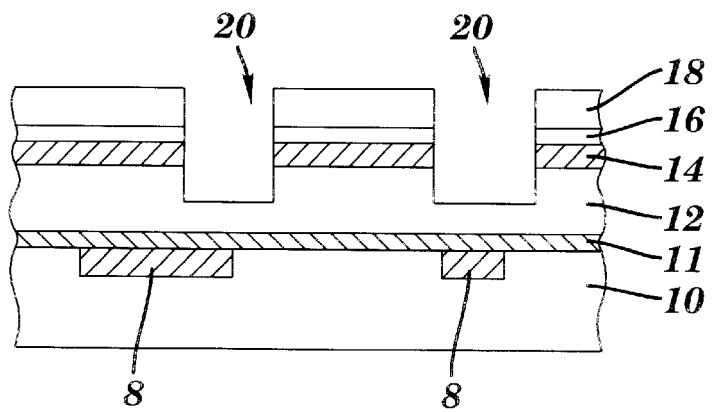
FIG. 5a depicts the formation of a trough, in accordance with a first embodiment of the present invention.

The troughs 20 are then etched partially into the insulative layer 12 using methods known in the industry, as illustrated in FIG. 5a. As with the ARC open RIE, it is preferable to oxygen dope the trough RIE process to prevent the formation of sacrificial conductive layer etch residuals. One example of a trough RIE process is shown in Table 1 (FIG. 14a).

Figure 6A:
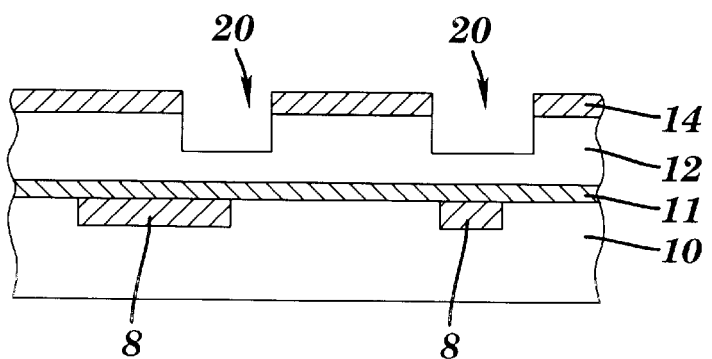
FIG. 6a depicts the removal of the first layer of photoresist and the optional antireflective coating, in accordance with a first embodiment of the present invention.

The first layer of photoresist 18 and the ARC 16 are removed or stripped, as shown in FIG. 6a. At this point in the process most or all of the conductive layer 14 still remains on the wafer 10. The conductive layer 14 should not be removed or significantly oxidized during the post trough etch photoresist strip process. In particular, it should remain on the wafer 10 at the subsequent lithographic patterning step to act as a conductive layer for the capacitive sensors to focus on. This means that the photoresist strip process and post strip wet or dry clean processes used after the trough RIE process must not remove or oxidize a significant amount of the conductive layer 14. If the conductive layer 14 is partially or fully oxidized or removed, then it will not act as a conductive layer during the second lithographic pattern step used in the dual-damascene process.

To minimize etching and oxidization of the conductive layer 14, the removal of the photoresist 18 and the ARC 16 should be performed using solvents, or using oxygen, ozone, or oxygen and ozone plasmas with low rf (radio frequency) bias power on the wafer 10 with wafer cooling (refer to Table 1 of FIG. 14a). In the alternative, a low temperature (under 200° C.) downstream plasma photoresist removal process, or any photoresist removal process which does not substantially oxidize or remove the conductive layer 14, may be used.

For both single- and dual-damascene processing, the photoresist 18 is sometimes removed from the wafer 10 prior to etching the circuit features (20 or 24) into the insulative layer 12 because the circuit features produced may be too small, too large, or are not properly aligned with the underlying circuit features. This process of removing the photoresist 18 prior to etching circuit features is commonly known as a "rework." After the rework, the photoresist 18 is applied and patterned as described previously. As with the photoresist strip process used after the first circuit feature is reactive ion etched, the photoresist rework process should not oxidize or remove the conductive layer 14. If the optional antireflective coating 16 is also removed during the photoresist rework, then the conductive layer 14 should also not be oxidized or removed. To minimize etching and oxidization of the conductive layer 14, the photoresist 18 and the ARC 16 rework should be performed using solvents, or using oxygen, ozone, or oxygen and ozone plasmas with low rf (radio frequency) bias power on the wafer 10 with wafer cooling (refer to Table 1 of FIG. 14a). In the alternative, a low temperature (under 200° C.) downstream plasma photoresist removal process, or any photoresist removal process which does not substantially oxidize or remove the conductive layer 14, may be used.

Figure 8B:
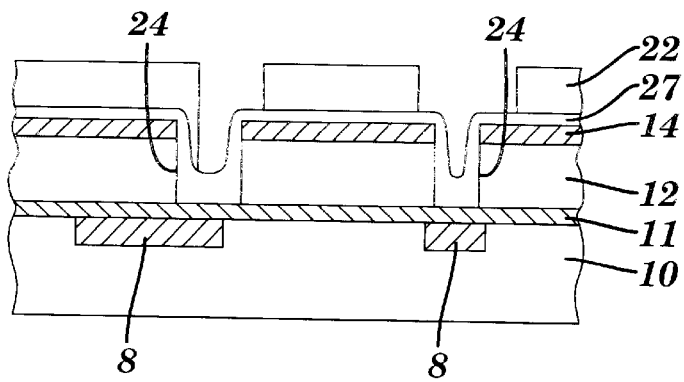
FIG. 8b depicts the patterning of the second layer of photoresist, in accordance with a second embodiment of the present invention.
Figure 7A:
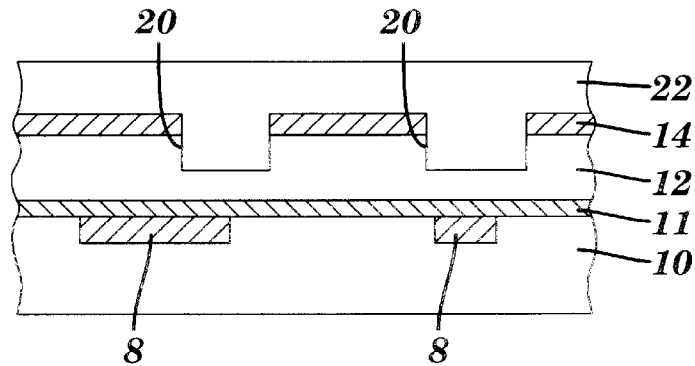
FIG. 7a depicts the wafer of FIG. 6a having a second layer of photoresist thereon, in accordance with a first embodiment of the present invention.
Figure 8A:
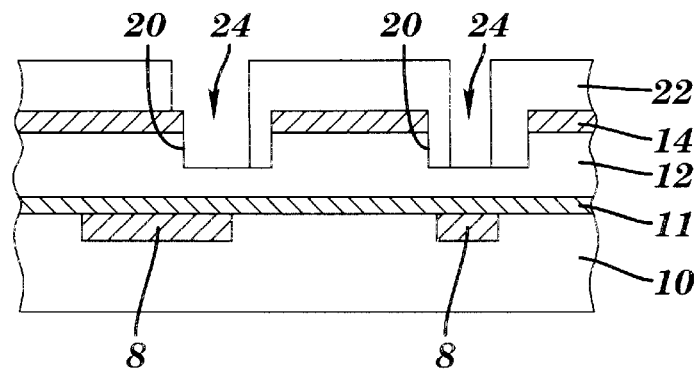
FIG. 8a depicts the patterning of the second layer of photoresist, in accordance with a first embodiment of the present invention.
Figure 9A:
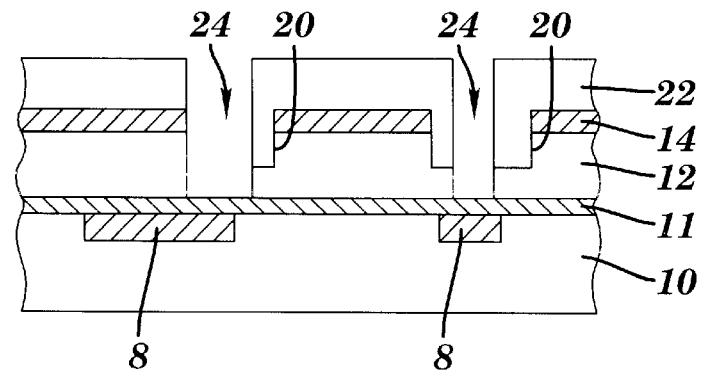
FIG. 9a depicts the formation of a via, in accordance with a first embodiment of the present invention.

At this point an optional layer of ARC (not shown) may be deposited over the conductive layer 14 if so desired. A second layer of photoresist 22 is spin-deposited onto the surface of the wafer 10, as shown in FIG. 7a. The second layer of photoresist 22 is exposed and developed, using the DUV lithography tool, to pattern a pair of second circuit features within the troughs 20, as shown in FIG. 8a. Using the second layer of photoresist 22 as a mask, portions of the conductive layer 14, and the insulative layer 12 are etched down to the diffusion barrier 11, using a RIE to form a pair of second circuit features, or in this example vias 24, as shown in FIG. 9a.

It should be noted that the etch process used to form the vias 24 is capable of etching solely the insulative layer 12, as illustrated by the via 24 on the right, wherein the via 24 is formed completely within the opening of the trough 20. The etch is also capable of etching the conductive layer 14, in addition to the second layer of photoresist 22 and the insulative layer 12, as illustrated by the via 24 on the left, wherein the via 24 is formed partially outside the opening of the trough 20. One example of a via etch process which can etch through both the sacrificial conductive layer 14 and the insulative layer 12 is shown in Table 1 (FIG. 14a). In addition, the vias 24 may be formed in alignment with the wiring 8, as the via 24 on the right illustrates, or the via 24 and the wiring 8 may be misaligned, as the via 24 on the left illustrates.

Figure 10:
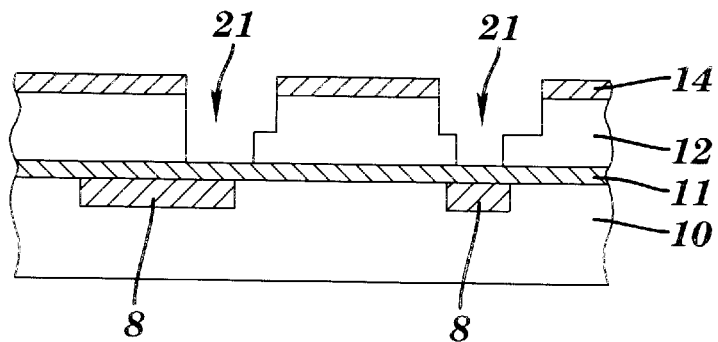
FIG. 10 depicts the removal of the second layer of photoresist and the antireflective coating (if present), in accordance with a preferred embodiment of the present invention.

The second layer of photoresist 22 is then removed, leaving openings 21, formed by the troughs 20 and vias 24, as shown in FIG. 10. Conventional stripping techniques, similar to those described above in conjunction with the removal of the first layer of photoresist 18, may be used to remove the second layer of photoresist 22. In this case, the conductive layer 14 may be partially or fully oxidized or removed during the strip.

Figure 11:
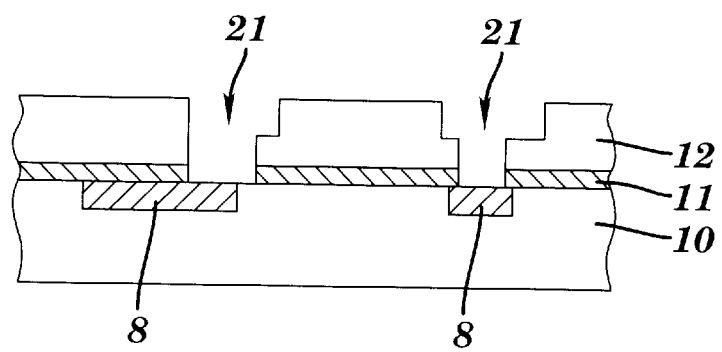
FIG. 11 depicts the removal of the conductive layer and a portion of the diffusion barrier, in accordance with a preferred embodiment of the present invention.

The conductive layer 14 and a portion of the diffusion barrier 11 within the openings 21 are then removed using a conventional etch, as illustrated in FIG. 11. It should be noted, however, that rather than removing the conductive layer 12 in a subsequent etch step, it is possible to use a stripping technique that removes the conductive layer 14 and the second layer of photoresist 22 in one step.

Figure 12A:
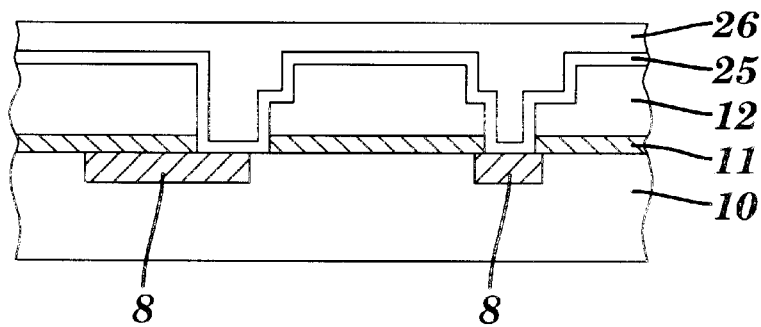
FIG. 12a depicts the deposition of a liner and a conductive layer, in accordance with a preferred embodiment of the present invention.
Figure 13:
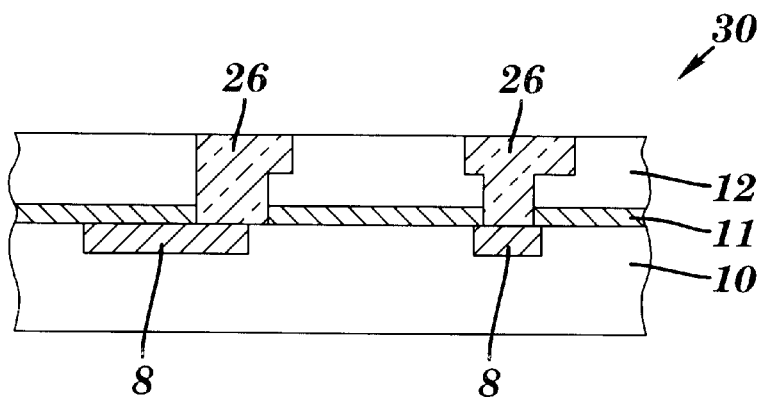
FIG. 13 depicts the dual-damascene structure so formed, in accordance with a preferred embodiment of the present invention.

After the standard post etch wafer clean processes, a thin liner 25, preferably a refractory metal such as 5–100 nm of TaN+Ta, is deposited over the surface of the wafer 10, as illustrated in FIG. 12a. The thin liner 25 may also be composed of a refractory metal silicide, nitride, etc. A,conductive material 26 is then deposited over the thin liner 25, filling the openings 21. The conductive material 26 is preferably a combination of PVD Cu (~50 nm) and electroplated copper (~1 um). In the alternative, the conductive material 25 may be aluminum, tungsten, copper, an aluminum-copper alloy, etc. The surface of the wafer 10 is then planarized, using a chemical-mechanical polishing (CMP) process, to form a dual-damascene structure 30, as shown in FIG. 13.

Figure 3B:
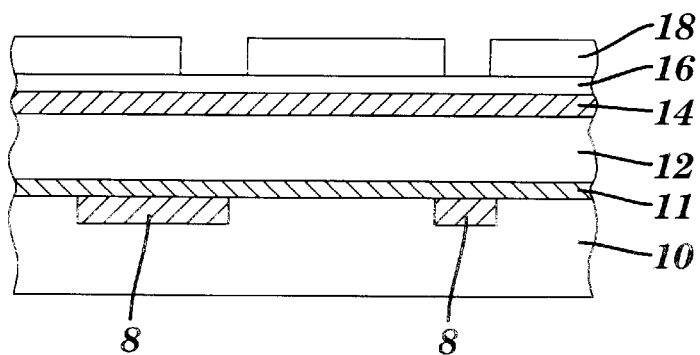
FIG. 3b depicts the wafer of FIG. 2a wherein the layer of photoresist is patterned, in accordance with a second embodiment of the present invention.

In a second embodiment of the present invention, illustrated in FIGS. 3b through 9b, the vias 24 and the troughs 20 of the dual-damascene structure 30 may be formed in reverse order. Following the formation of the structure depicted in FIG. 2a, the first layer of photoresist 18 is exposed and developed to pattern the first circuit features using the DUV lithography tool, as shown in FIG. 3b.

Figure 4B:
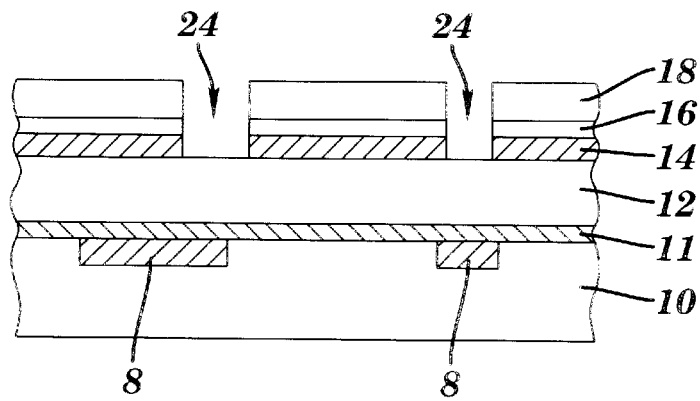
FIG. 4b depicts the etching of the optional antireflective coating and the conductive layer, in accordance with a second embodiment of the present invention.
Figure 4A:
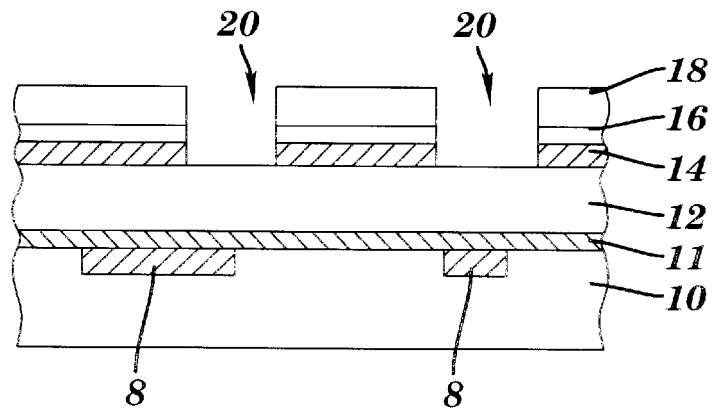
FIG. 4a depicts the etching of the optional antireflective coating and the conductive layer, in accordance with a first embodiment of the present invention.
Figure 6B:
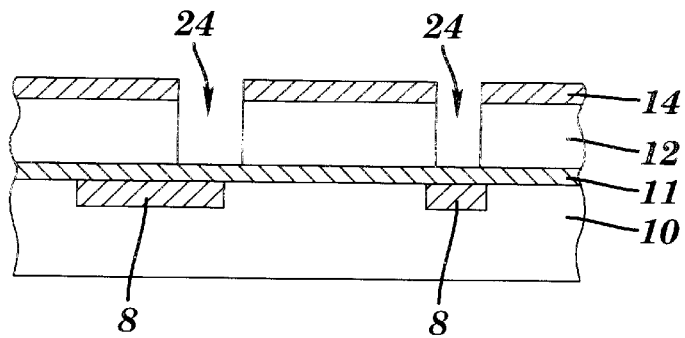
FIG. 6b depicts the removal of the first layer of photoresist and the optional antireflective coating, in accordance with a second embodiment of the present invention.

The vias 24 are formed using an ARC-open etch, similar to the one described above, within the ARC 16 and the conductive layer 14, as shown in FIG. 4b. The vias 24 are then etched through the insulative layer 12, stopping at the diffusion barrier 11, as shown in FIG. 5b. The remaining portions of the first layer of photoresist 18 and the ARC 16 are removed, taking care not to remove or oxidize the remaining portions of the conductive layer 14, as illustrated in FIG. 6b.

Figure 7B:
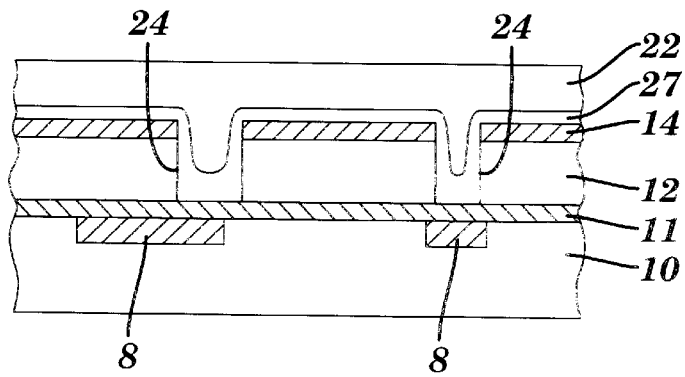
FIG. 7b depicts the wafer of FIG. 6b having an antireflective coating and a second layer of photoresist thereon, in accordance with a second embodiment of the present invention.
Figure 9B:
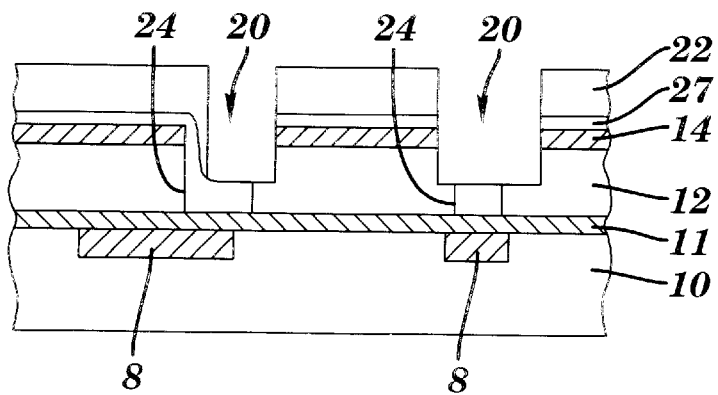
FIG. 9b depicts the formation of a trough, in accordance with a second embodiment of the present invention.

A spin-on ARC 27 is deposited over the conductive layer 14, cured at approximately 90° C. and reflow baked at a low temperature (approximately 200° C.) thereby causing the ARC 27 to reflow into the vias 24, as known in the art (FIG. 7b). In the alternative, a standard conformal ARC, which would not be reflowed into the vias (not shown), may be used. It should also be understood that no ARC 27 is necessary, and the present invention could be performed without the use of an ARC 27. A second layer of photoresist 22 is deposited over the spin-on ARC 27. The second layer of photoresist 22 is then patterned using the DUV lithography tool, as shown in FIG. 8b. The ARC 27 and conductive layer 14 are etched using a RIE process similar to the one discussed previously (see Table 2 of FIG. 14b). The insulative layer 12 is then etched to form the troughs 20, as illustrated in FIG. 9b. As with the trough first, via second dual-damascene process discussed previously, oxygen doping of the ARC-open, conductive layer, and insulator RIE process is preferred to avoid conductive layer etch residuals.

The second layer of photoresist 22 and the ARC 27 are removed using standard photoresist strip processes, thereby forming openings 21, as shown in FIG. 10. The diffusion barrier 11 within the openings 21 and the conductive layer 14 are removed by etching, as depicted in FIG. 11. The thin liner 25 and the conductive material 26 are deposited, as depicted in FIG. 12a and described above. The surface of the wafer 10 is then planarized thereby forming the dual-damascene structure 30 shown in FIG. 13.

Figure 12B:
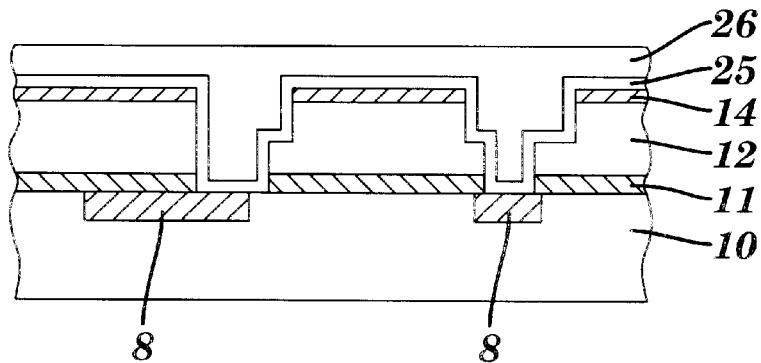
FIG. 12b depicts the deposition of a liner and a conductive layer, in accordance with an alternate embodiment of the present invention.

For both the first and second embodiments, the conductive layer 14 may remain on the wafer 10 during the removal of the diffusion barrier 11. In particular, following the removal of a portion of the diffusion barrier 11, shown in FIG. 11, the thin liner 25 and the conductive material 26 are deposited there over, as illustrated in FIG. 12b. The surface of the wafer 10 is then planarized, thereby removing the conductive layer 14, such that the dual-damascene structure 30 is formed, as illustrated in FIG. 13.

In a third embodiment of the present invention, it is possible that different photolithography tools may be used for the first and second photoresist patterning steps and, although one of the photolithography tools may use a capacitive focus sensor, the other tool may not. In that case, the conductive layer 14 used as a focus for the capacitive sensors would not be required during both photolithographic pattern steps. If the conductive layer 14 is not required for the first photolithographic patterning step, then it might be desirable to pattern and etch the first circuit feature (20 or 24) into the insulative layer 12 without the conductive layer 14, and subsequently deposit the conductive layer 14 on the wafer 10 prior to lithographically patterning the second circuit feature.

Figure 15A:
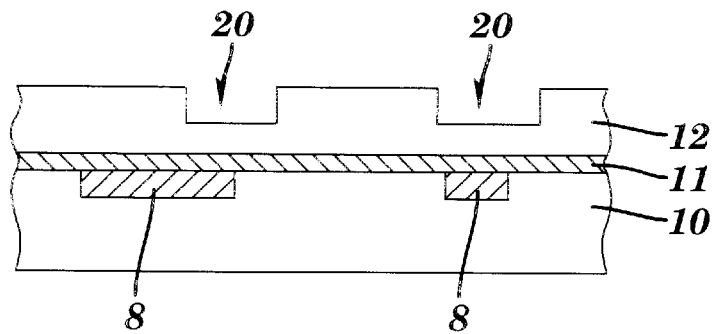
FIG. 15a depicts the formation of a trough, in accordance with a third embodiment of the present invention.
Figure 16A:
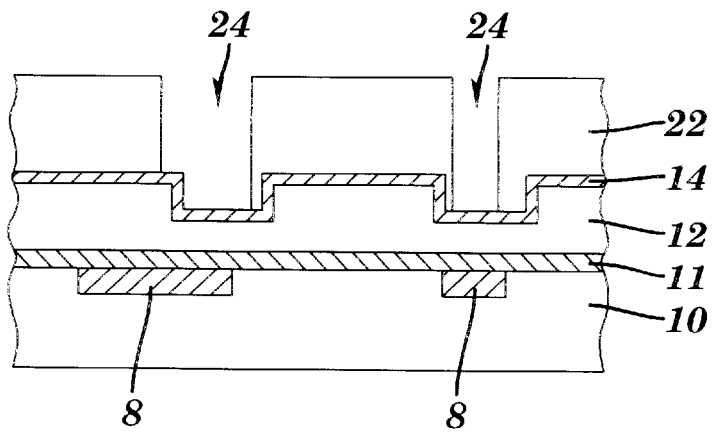
FIG. 16a depicts the deposition of a conductive layer and a layer of photoresist, in accordance with a third embodiment of the present invention.

For instance, FIG. 15a shows the wafer 10 after the first circuit feature, a trough 20 in this instance, has been patterned and etched into the insulative layer 12, without the use of a conductive layer 14. The conductive layer 14 is then deposited, followed by a layer of photoresist 22. The second circuit feature, a via 24, is patterned in the layer of photoresist 22, as shown in FIG. 16a. At this point, the via 24 would be etched and metallized as previously discussed in the conjunction with the first and second embodiments, to form the dual-damascene structure 30 depicted in FIG. 13.

Figure 15B:
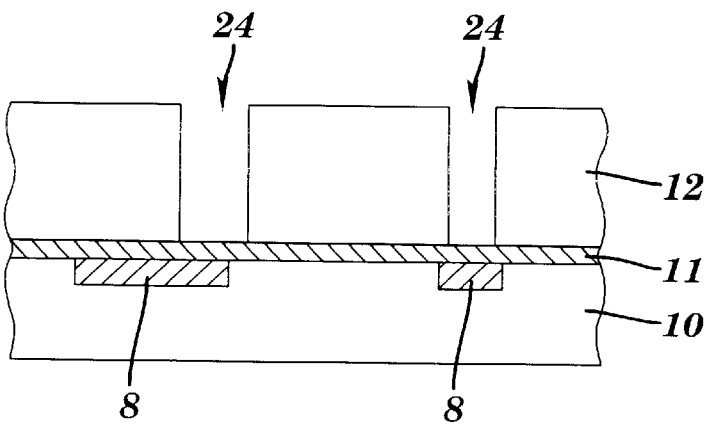
FIG. 15b depicts the formation of a via, in accordance with a third embodiment of the present invention.
Figure 16B:
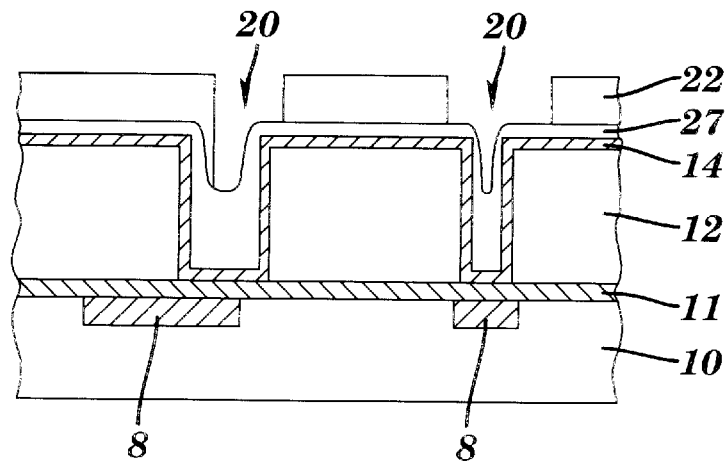
FIG. 16b depicts the deposition of a conductive layer, a liner and a layer of photoresist, in accordance with a third embodiment of the present invention.

Similarly, as depicted in FIG. 15b, the via 24 may be formed first without the conductive layer 14. The conductive layer 14 may then be deposited, as well as the thin liner 27, and the layer of photoresist 22. The trough 20 is then patterned in the layer of photoresist 22, as illustrated in FIG. 16b, followed by an etch and metallization step previously described to form the dual-damascene structure 30 depicted in FIG. 13.

Figure 17A:
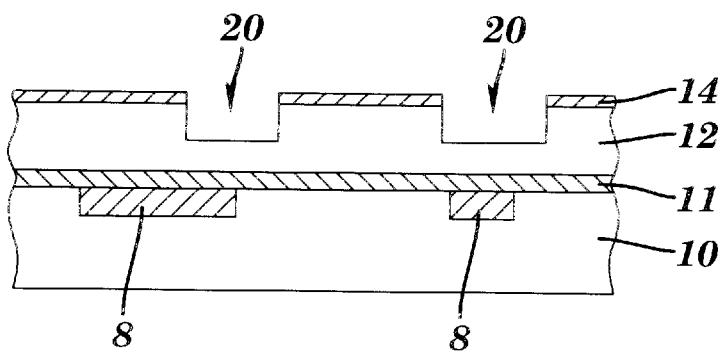
FIG. 17a depicts the formation of a trough using the conductive layer, in accordance with a fourth embodiment of the present invention.
Figure 18A:
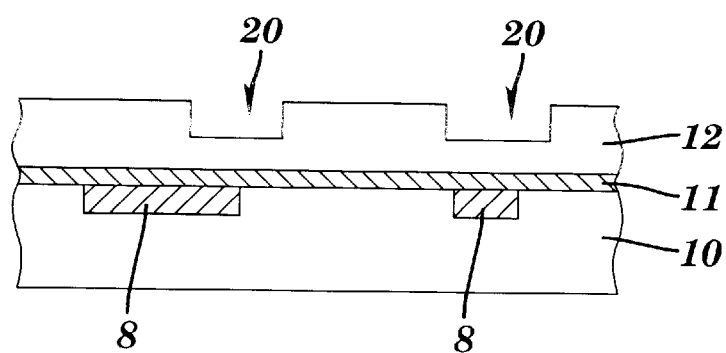
FIG. 18a depicts the removal of the conductive layer, in accordance with a fourth embodiment of the present invention.
Figure 19A:
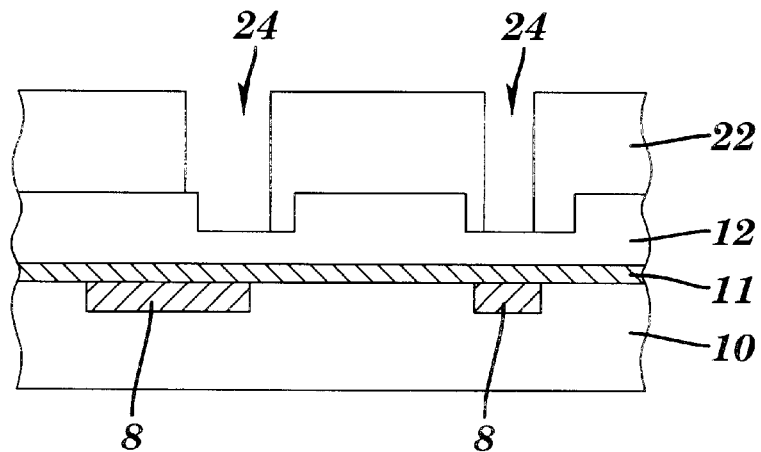
FIG. 19a depicts the formation of a via in a layer of photoresist, in accordance with a fourth embodiment of the present invention.

In a fourth embodiment, the conductive layer 14 may be required for the first dual-damascene photolithographic step but not for the second. In this case, it may be desirable to remove the conductive layer 14 prior to the second photolithograhpic pattern step, as illustrated in FIGS. 17–19. In particular, FIG. 17a shows the wafer 10 after the trough 20 has been patterned and etched into the insulative layer 12, utilizing the conductive layer 14. The conductive layer 14 may then be removed, as shown in FIG. 18a prior to the deposition of the layer of photoresist 22. The vias 24 are then patterned into the layer of photoresist 22, as shown in FIG. 19a. In this case, the conductive layer 14 is preferably removed using a wet etch process which is selective to the insulative layer 12, although any wet chemical or dry reactive ion etch could be used. If tungsten is used for the conductive layer 14, then a hydrogen peroxide or dilute sulfuric acid plus hydrogen peroxide wet etch could be used to remove the tungsten.

Figure 17B:
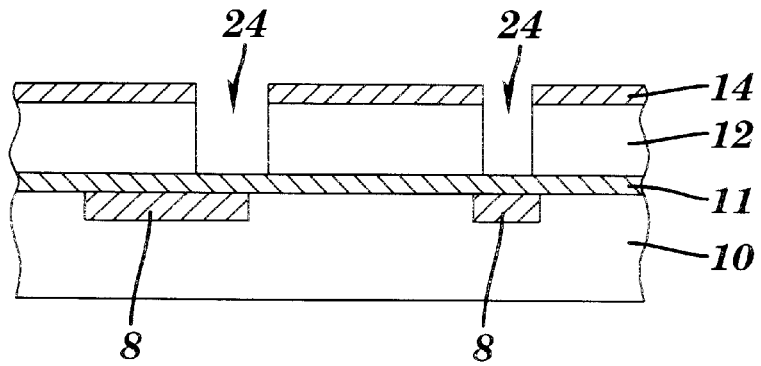
FIG. 17b depicts the formation of a via using a conductive layer, in accordance with a fourth embodiment of the present invention.
Figure 18B:
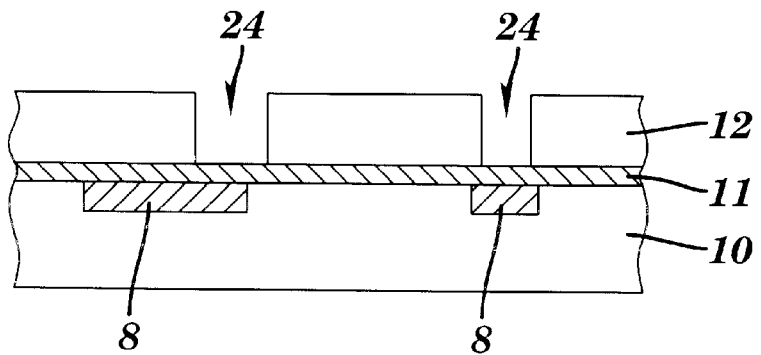
FIG. 18b depicts the removal of the conductive layer, in accordance with a fourth embodiment of the present invention.
Figure 19B:
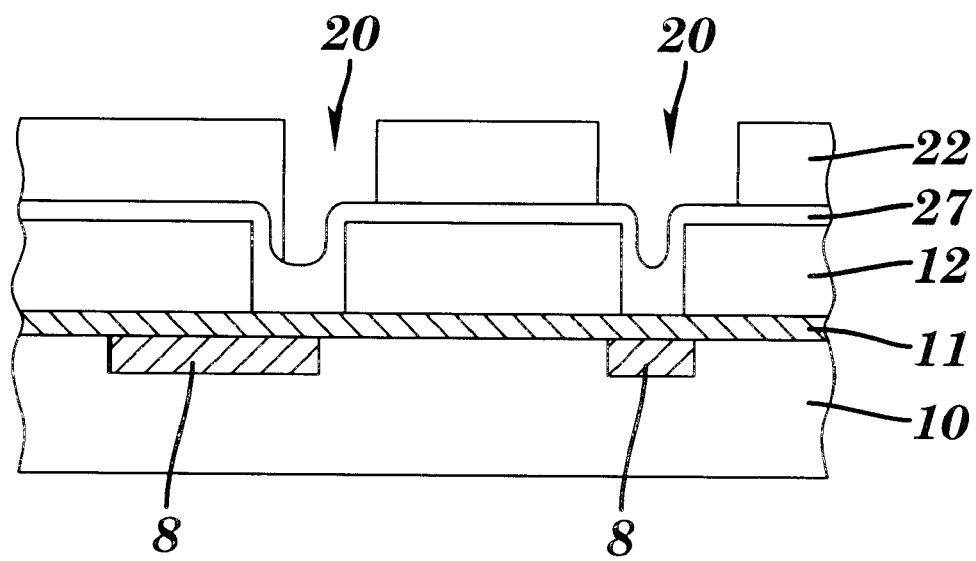
FIG. 19b depicts the formation of a trough in a layer of photoresist, in accordance with a fourth embodiment of the present invention.

Similarly, FIG. 17b illustrates the formation of the vias 24 first, using the sacrificial conductive layer 14, followed by the removal of the conductive layer 14, as depicted in FIG. 18b. The thin liner 27 and the layer of photoresist 22 are deposited, and the troughs 20 are patterned in the layer of photoresist 22 (FIG. 19b).

In all four embodiments, the conductive layer 14 deposited over the insulative layer 12 provides a uniform focus plane for the DUV lithography tool during patterning. In other words, the distance between the DUV lithography tool and the wafer 10 remains constant while the circuit features are patterned onto the surface of the wafer 10. Without the use of this sacrificial conductive layer 14, the focus tends to drift or fluctuate between the layers of the wafer 10, producing open and/or blown features, as previously described in the problem statement.

It should be noted that oxygen gas is preferably included in the etch chemistry used to etch through the ARC 16, the conductive layer 14, and the insulative layer 12, in addition to the RIE chemistry used to form the circuit features 20, 24. The addition of small amounts of oxygen (typically 1–100 sccm) reduces or eliminates the formation of conductive layer residuals along the periphery or sides of the circuit features being etched. The oxygen also prevents polymer deposition on the wafer 10 during the removal of the diffusion barrier 11.

It should also be understood by those skilled in the art, that a single-damascene structure may be formed using the present invention by depositing the thin liner 25 and the conductive material 26 after the formation of the first circuit features. The surface of the wafer 10, having a single circuit feature, either a trough 20 or via 24, is then planarized to form the finished structure (not shown).

It should also be understood by those skilled in the art, that although the present invention was described in conjunction with single- and dual-damascene structures, the present invention may also be used in conjunction with the formation of damascene structures having more than two circuit features therein.

It should also be understood by those skilled in the art that, although the present invention was described in conjunction with an organic-based spin-on ARC and photoresist, any ARC or photoresist, such as those deposited using PECVD, could be used.

While this invention has been described in conjunction with the specific embodiments outlined above, it is evident that many alternatives, modifications and variations will be apparent to those skilled in the art. Accordingly, the preferred embodiments of the invention as set forth above are intended to be illustrative, not limiting. Various changes may be made without departing from the spirit and scope of the invention as defined in the following claims.

We claim:

1. A damascene structure comprising:
    a semiconductor wafer;
    an insulative layer including a single insulative material, wherein the insulative layer is on the wafer, and wherein the insulative material is in direct mechanical contact with the wafer;
    a sacrificial conductive layer providing a uniform focus plane for a photolithography tool during patterning of at least one circuit feature, wherein the sacrificial conductive layer is on the insulative layer, and wherein the insulative material is in direct mechanical contact with the sacrificial conductive layer; and
    a layer structure on the sacrificial conductive layer, wherein the layer structure is selected from the group consisting of a first layer structure, a second layer structure, and a third layer structure,
    wherein the first layer comprises a first photoresist layer on the sacrificial conductive layer and in direct mechanical contact with the sacrificial conductive layer such that the first photoresist layer is adapted to be directly exposed to the photolithography tool,
    wherein the second layer structure comprises an antireflective coating on the sacrificial conductive layer and in direct mechanical contact with the sacrificial conductive layer, and wherein the second layer structure further comprises a second photoresist layer on the antireflective coating and in direct mechanical contact with the antireflective coating such that the second photoresist layer is adapted to be directly exposed to the photolithography tool, and
    wherein the third layer structure comprises the antireflective coating on the sacrificial conductive layer and in direct mechanical contact with the sacrificial conductive layer, wherein the third layer structure further comprises a thin layer of dielectric material on the antireflective coating and in direct mechanical contact with antireflective coating, and wherein the third layer structure further comprises a third photoresist layer on the thin layer of dielectric material and in direct mechanical contact with the thin layer of dielectric material such that the third photoresist layer is adapted to be directly exposed to the photolithography tool.

2. The damascene structure of claim 1, wherein the at least one circuit feature includes at least one of a trough and a via.

3. The damascene structure of claim 1, wherein the damascene structure is a single-damascene structure or a dual-damascene structure.

4. The damascene structure of claim 1, wherein the sacrificial conductive layer has a continuously distributed planar shape over an entire surface of the insulative layer.

5. The damascene structure of claim 1, wherein the sacrificial conductive layer comprises a refractory metal, a metal nitride, or a metal silicide.

6. The damascene structure of claim 1, wherein the insulative material is selected from the group consisting of silicon dioxide and silicon nitride.

7. The damascene structure of claim 1, wherein the layer structure consists of the first layer structure.

8. The damascene structure of claim 1, wherein the layer structure consists of the second layer structure.

9. The damascene structure of claim 1, wherein the layer structure consists of the third layer structure.

10. Damascene structure of claim 9, wherein the thin layer of dielectric material has a thickness in a range of 5 nanometers to 250 nanometers.

11. A damascene structure, comprising:
    semiconductor wafer including wiring therein, wherein the wiring comprises copper;
    a diffusion barrier layer on the wafer and in direct mechanical contact with the wafer;

an insulative layer including a single insulative material, wherein the insulative layer is on the diffusion barrier layer and in direct mechanical contact with the diffusion barrier layer, and wherein the diffusion barrier layer is adapted to prevent said copper in said wiring from diffusing into the insulative layer;

a sacrificial conductive layer providing a uniform focus plane for a photolithography tool during patterning of at least one circuit feature, wherein the sacrificial conductive layer is on the insulative layer, and wherein the insulative material is in direct mechanical contact with the sacrificial conductive layer; and a layer structure on the sacrificial conductive layer, wherein the layer structure is selected from the group consisting of a first layer structure, a second layer structure, and a third layer structure, wherein the first layer comprises a first photoresist layer on the sacrificial conductive layer and in direct mechanical contact with the sacrificial conductive layer such that the first photoresist layer is adapted to be directly exposed to the photolithography tool, wherein the second layer structure comprises an antireflective coating on the sacrificial conductive layer and in direct mechanical contact with the sacrificial conductive layer, and wherein the second layer structure further comprises a second photoresist layer on the antireflective coating and in direct mechanical contact with the antireflective coating such that the second photoresist layer is adapted to be directly exposed to the photolithography tool, and wherein the third layer structure comprises the antireflective coating on the sacrificial conductive layer and in direct mechanical contact with the sacrificial conductive layer, wherein the third layer structure further comprises a thin layer of dielectric material on the antireflective coating and in direct mechanical contact with antireflective coating, and wherein the third layer structure further comprises a third photoresist layer on the thin layer of dielectric material and in direct mechanical contact with the thin layer of dielectric material such that the third photoresist layer is adapted to be directly exposed to the photolithography tool.

12. The damascene structure of claim 11, wherein the at least one circuit feature includes at least one of a trough and a via.

13. The damascene structure of claim 11, wherein the damascene structure is a single-damascene structure or a dual-damascene structure.

14. The damascene structure of claim 11, wherein the sacrificial conductive layer has a continuously distributed planar shape over an entire surface of the insulative layer.

15. The damascene structure of claim 11, wherein the sacrificial conductive layer comprises a refractory metal, a metal nitride, or a metal silicide.

16. The damascene structure of claim 11, wherein the insulative material is selected from the group consisting of silicon dioxide and silicon nitride.

17. The damascene structure of claim 11, wherein the layer structure consists of the first layer structure.

18. The damascene structure of claim 11, wherein the layer structure consists of the second layer structure.

19. The damascene structure of claim 11, wherein the layer structure consists of the third layer structure.

20. damescene structure of claim 19, wherein the thin layer of dielectric material has a thickness in a range of 5 nanometers to 250 nanometers.

* * * * *